United States Patent
Murakami et al.

[11] Patent Number: 6,153,515
[45] Date of Patent: Nov. 28, 2000

[54] METHOD OF FORMING MULTILAYERED FILM

[75] Inventors: Seishi Murakami; Tatsuo Hatano, both of Yamanashi-ken, Japan

[73] Assignee: Tokyo Electron Limited, Tokyo, Japan

[21] Appl. No.: 09/156,896

[22] Filed: Sep. 18, 1998

[30] Foreign Application Priority Data

Sep. 22, 1997  [JP]  Japan .................................. 9-273307

[51] Int. Cl.$^7$ ...................................................... H01L 21/44
[52] U.S. Cl. ........................... 438/643; 438/653; 438/656; 438/685; 257/751; 257/753
[58] Field of Search ..................................... 438/372, 675, 438/681, 653, 654, 655, 656, 685, 680; 257/508, 448, 514, 622, 751, 753, 755, 757; 204/192, 194

[56] References Cited

U.S. PATENT DOCUMENTS

| | | | |
|---|---|---|---|
| 5,141,897 | 8/1992 | Manocha et al. | 437/228 |
| 5,187,120 | 2/1993 | Wang | 437/192 |
| 5,200,639 | 4/1993 | Ishizuka et al. | 257/508 |
| 5,209,816 | 5/1993 | Yu et al. | 156/636 |
| 5,217,756 | 6/1993 | Shinzawa | 427/252 |
| 5,231,056 | 7/1993 | Sandhu | 437/200 |
| 5,270,254 | 12/1993 | Chen et al. | 437/190 |
| 5,288,665 | 2/1994 | Nulman | 437/194 |
| 5,330,921 | 7/1994 | Yoshida et al. | 437/25 |
| 5,344,792 | 9/1994 | Sandu et al. | 437/200 |
| 5,663,097 | 9/1997 | Sakamoto et al. | 438/392 |
| 5,834,846 | 11/1998 | Shinriki et al. | 257/754 |
| 5,858,184 | 1/1999 | Fu et al. | 204/192 |
| 5,869,901 | 3/1999 | Kusuyama | 257/263 |
| 5,877,086 | 3/1999 | Aruga | 438/653 |

*Primary Examiner*—Charles Bowers
*Assistant Examiner*—Laura M Schillinger
*Attorney, Agent, or Firm*—Oblon, Spivak, McClelland, Maier & Neustadt, P.C.

[57] ABSTRACT

There is provided a method of forming a structure connecting a first conductive layer and a second conductive layer in a semiconductor device comprising the steps of forming an insulating film on the first conductive layer, forming a hole in the insulating layer in which a surface of the first conductive layer is partially exposed, forming a titanium layer on a surface of the first conductive layer exposed at least in the hole, nitriding a surface of the titanium layer, oxidizing an un-nitrided part of the surface of the titanium layer, forming a titanium nitride layer on the titanium layer, and forming the second conductive layer on the titanium nitride layer.

33 Claims, 4 Drawing Sheets

METHOD OF FORMING MULTILAYERED FILM

BACKGROUND OF THE INVENTION

The present invention relates to a method of forming a multilayered film of a titanium (Ti) film or the like between an electrode and wiring of a semiconductor circuit device.

Recently, to satisfy the requirements for high density and high integration of circuit elements in manufacturing the semiconductor device, a multilayered wiring structure tends to be employed as the semiconductor circuit. In this circumstance, a technique for electrically connecting a circuit element formed in a silicon substrate to an upper wiring layer through a contact hole and mutually connecting an upper wiring layer and a lower wiring layer through a via hole becomes important. To be more specific, a technique for burying a metal in the contact hole and the via-hole becomes important.

As the metal to be buried in the contact hole and the via-hole, aluminium (Al) or tungsten (W), or an alloy mainly made of the aforementioned metal, is generally employed. However, in the case where the metal or the alloy is in direct contact with the silicon substrate or an Al wiring, if annealing is applied in a later step, an alloy of the buried metal and Si or Al is likely to be formed in the boundary portion between them since Al absorbs the contact metal. The formation of such an alloy is not preferable since the alloy has a large electric resistance. The alloy, due to the large electric resistance, works against a reduction of power consumption and a speedy operation recently required for the device.

It is also not preferable to use W or a W alloy as the buried layer of the contact hole, since $WF_6$ gas, for use in burying W or the W alloy, penetrates into the Si substrate and degrading electric characteristics of the device.

To prevent the aforementioned undesirable features, a contact metal layer is formed as a barrier layer on the Si substrate and the inner wall of the contact hole or the via-hole so that the contact metal layer may be interposed between the buried metal layer and the Si substrate or the inner wall.

As the contact metal layer, a two-layered film constituting of a Ti film and a TiN film, is generally employed. The two-layered contact metal layer is conventionally formed by a physical vapor deposition (PVD) method. However, with the tendency for fine patterns and high integration of the circuit device, wiring width and an aperture of the holes has been reduced.

In addition to this, the holes tend to be formed in a higher aspect ratio, recently. For these reasons, a chemical vapor deposition (CVD) method has been increasingly employed since the CVD method is also suitable for forming the holes of the higher aspect ratio.

However, in this case where $TiCl_4$ is employed as the reaction gas in the CVD method, $Cl_2$ and HCl generate as by-products. Since these gases etch the Ti film, the TiN film loses sufficient contact with the Ti film. As a result, TiN film removes from the Ti film, increasing contact resistance.

To overcome the increase in contact resistance, a method in which the TiN film is formed after the Ti film surface is nitrided with nitrogen gas and hydrogen gas, is proposed by the present inventors (filed as U.S. Pat. No. 941,272).

According to this method, since the Ti film surface is protected with a thin nitride film, the Ti film is prevented from being etched, reducing the contact resistance.

However, the thin nitride film thus formed on the Ti film surface does not always exhibit a sufficient effect for preventing etching of the Ti film surface. As a matter of fact, it is known that the TiN film sometimes removes from the Ti film, thereby increasing the contact resistance.

The occurrence of film removal is not limited to the case where the TiN film is formed on the Ti film and may arise in the case where another type of film is formed on the Ti film by using a halogen containing gas. Hence, it has been desired to find effective means to overcome the film removal.

BRIEF SUMMARY OF THE INVENTION

To overcome the aforementioned problems, the present invention provides a method of forming a structure connecting a first conductive layer and a second conductive layer in a semiconductor device comprising the steps of:

forming an insulating film on the first conductive layer;

forming a hole in the insulating layer in which a surface of the first conductive layer is partially exposed;

forming a titanium layer on a surface of the first conductive layer exposed in the hole;

nitriding a surface of the titanium layer;

oxidizing an un-nitrided part of the surface of the titanium layer;

forming a titanium nitride layer on the titanium layer; and forming the second conductive layer on the titanium nitride layer.

In another aspect, the present invention provides a method of forming a multilayered film interposed between a first conductive layer and a second conductive layer in a semiconductor device, comprising the steps of:

forming a titanium layer on the first conductive layer;

nitriding a surface of the titanium layer;

oxidizing at least an un-nitrided part of the surface of the titanium layer;

forming another film by CVD (chemical vapor deposition) on the titanium layer; and forming the second conductive layer on the another film.

In a further aspect of the present invention, there is provided a method of forming a multilayered film interposed between a first conductive layer and a second conductive layer, comprising the steps of:

forming a titanium layer serving as an underlying layer of the multilayered film on a surface of the first conductive layer;

nitriding a major portion of a surface of the titanium layer;

oxidizing a remaining portion of the surface of the titanium layer; and forming a titanium nitride layer serving as an upper layer of the multilayered film, on the titanium layer.

The first and second conductive layers are typically a combination of members capable of electrically connecting, which are selected from the group consisting of a diffusion layer formed in the semiconductor substrate, a metal wiring layer formed above the semiconductor substrate, and a metal plug buried in the hole in the insulating layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

Now, embodiments of the present invention will be explained with reference to the accompanying drawings.

Figure 2:
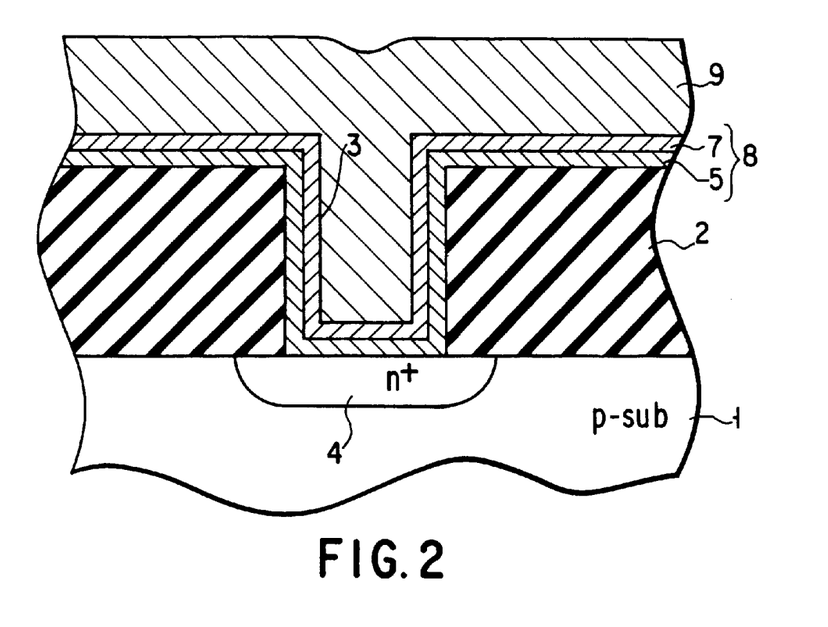
FIG. 2 is a cross-sectional view of a semiconductor device formed in accordance with an embodiment of the present invention.

FIG. 2 partly shows a cross-sectional view of the semiconductor device formed in accordance with the method of forming a multilayered film of the present invention.

A contact hole (or via hole) 3 is formed in an insulating layer 2 so as to expose a circuit element (e.g., a diffusion layer 4 serving as an element electrode) formed in a silicon semiconductor substrate 1. Then, a contact metal (barrier metal) layer 8 constituted of a Ti film 5 and a TiN film 7 is formed on the wall of the contact hole (or via hole) 3 and the diffusion layer 4. Thereafter, an Al layer 9 serving as wiring is buried in the contact hole 3.

Next, we will explain a gist of the present invention, namely, the reasons why Ti film 5 is oxidized after it is nitrided.

The present inventors investigated the reasons why the film removal takes place when the Ti film is nitrided by the conventional method, in order to overcome an increase of the contact resistance.

As a result, they found that the Ti film surface is not completely nitrided by the conventional nitriding method, and that active Ti still remains without being terminated (reacted) with N. They further investigated and revealed that the remaining Ti reacts with a halogen containing gas (e.g., $Cl_2$ and HCl) which is generated when the TiN film is formed consecutively on the Ti film.

They further found that the remaining active Ti may be oxidized and therefore the reaction with the halogen containing gas is prevented. The active Ti remaining on the film surface can be terminated with oxygen without fail since oxygen has a high affinity with titanium (Ti).

It has been a general way to avoid forming $TiO_2$ since titanium oxide ($TiO_2$) exhibits a high resistance. However, in the present invention, Ti remaining on the TiN film surface dares to be oxidized. Since Ti not terminated with N in the nitriding process presents in few amount, little adverse effect is produced by the Ti oxidation. It is therefore possible to effectively prevent the reaction between Ti and the halogen containing gas.

Now, the barrier metal film formation method of the present invention will be explained with reference to the manufacturing steps shown in FIGS. 1A to 1E.

Figure 1A:
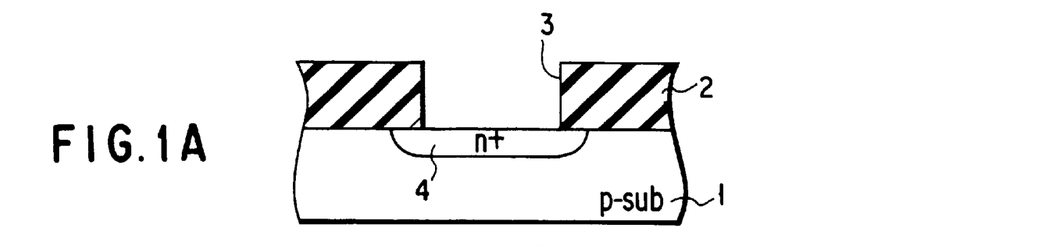
FIGS. 1A to 1E explain how to form a barrier metal film according to an embodiment of the present invention.

As shown in FIG. 1A, an insulating film 2 such as a silicon oxide film, is first formed on a semiconductor substrate 1 and then a contact hole 3 is formed. A diffusion region 4 is formed by doping impurities from the opening of the contact hole 3.

Figure 1B:
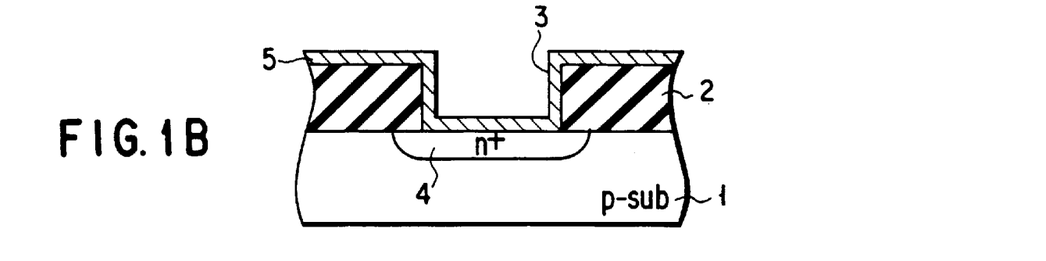

As shown in FIG. 1B, a Ti film 5 is formed on a wall of the contact hole 3, the diffusion region 4 and the insulating layer 2. The Ti film 5 is formed by the PVD method or the CVD method.

Figure 1C:
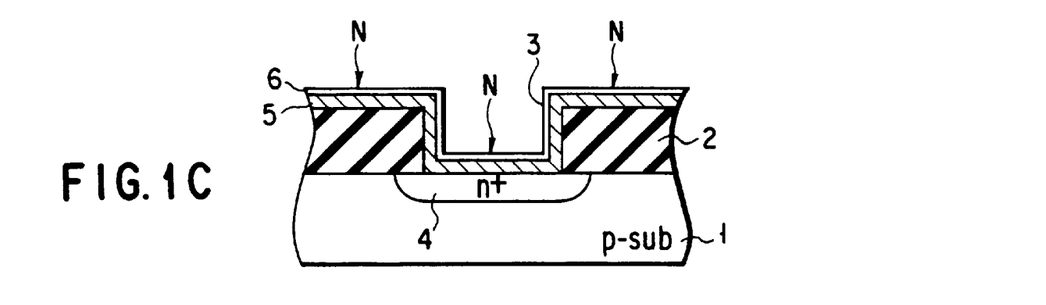

As shown in FIG. 1C, the surface of the Ti film 5 is nitrided by a nitrogen-containing processing gas to form a thin nitride film 6. As the nitrogen-containing processing gas, $N_2$ gas, $NH_3$ gas, or the like may be used. However, if a by-product is present, it will be nitrided to cause the film removal. In view of this, a $N_2$–$H_2$ gas mixture is particularly preferable. Nitriding may be effected by only heating the substrate while supplying the nitrogen containing process gas. However, it is preferred to nitride the film in a plasma atmosphere.

Most of active titanium (Ti) present on the surface of the Ti film 5 is terminated in the nitriding process. However, Ti not terminated with N remains in a few amount.

Figure 1D:
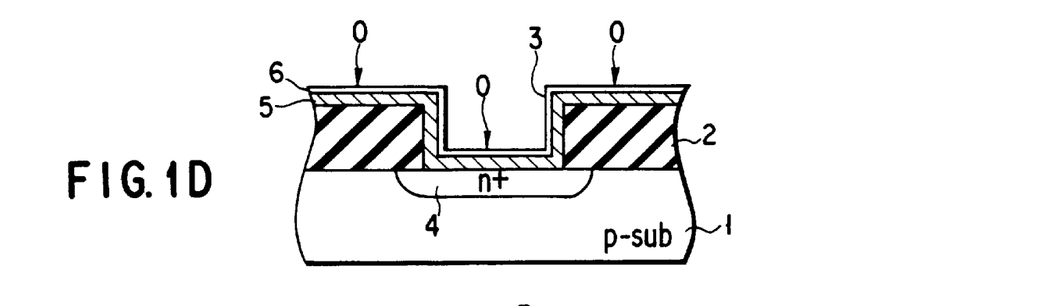

Then, as shown in FIG. 1D, the present invention devised that Ti not terminated with a nitrogen molecule (N) and remains on the surface of the Ti film 5, is terminated with oxygen (O) having a high affinity with Ti, by supplying an oxygen-containing gas to the Ti film 5 after the nitriding treatment.

In this manner, it is possible to prevent the Ti film 5 from being etched with $Cl_2$ gas or HCl gas in a later CVD-TiN film formation step. As the oxygen containing gas used herein, any gas may be used as long as it oxidizes Ti. For example, active oxygen (e.g. $O_2$ gas, air, and $O_3$), $H_2O$, $N_2O$, $NO_2$ may be used. The temperature of oxidation treatment may be determined appropriately depending upon the type of gas; however, when $O_2$ gas or air is used, oxidation can be sufficiently performed at normal temperature.

The oxidation treatment may be performed either in the Ti film deposition chamber by introducing the oxygen-containing gas therein while the semiconductor substrate placed therein after the Ti-film nitriding is completed or in the TiN film deposition chamber after the substrate is transferred to a TiN film deposition chamber. Alternatively, oxidation may be performed after completion of nitriding treatment by exposing the substrate to the air.

Figure 1E:
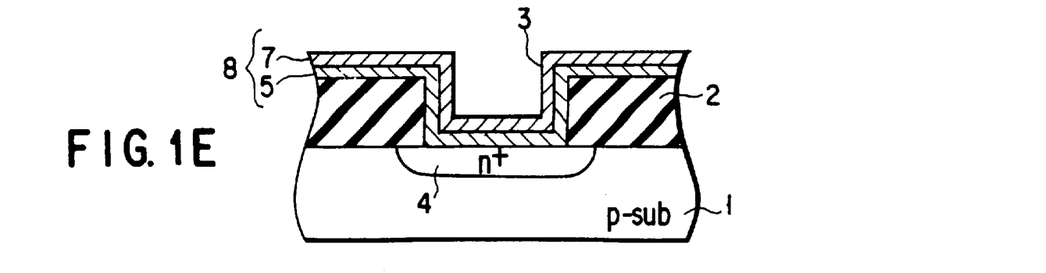

After oxidation, as shown in FIG. 1E, a TiN film 7 is formed by the CVD method on the Ti film 5 with the nitrided film 6 interposed between them. In this case, $TiCl_4$ and either $NH_3$ or monomethylhydrazine (MMH) are used as the reaction gas and $N_2$ is used as the carrier gas. The nitrided film 6 becomes a part of the TiN film 7 by forming the TiN film 7 thereon. As a result, the contact metal layer 8 constituted of two layers, the Ti film 5 and the TiN film 7, is formed. The film thickness of Ti film 5 and TiN film 7 is set at, for example, about 50 nm each.

Thereafter, the Al layer 9 serving as a wiring layer is formed on the contact metal layer 8 to thereby form the buried layer in the contact hole 3 and wiring at the same time. In this manner, the structure shown in FIG. 2 is obtained.

The diffusion region 4 in the semiconductor substrate 1 and the wiring are electrically communicated with each other by burring the Al layer 9 into the contact hole 3. In this case, since the reaction between Al and Si can be prevented by the presence of the contact metal layer 8, precipitation of a highly resistant compound is avoided. Although Al is used as the wiring layer in this embodiment, the material of the wiring layer is not limited to Al. An Al alloy, W, or a W alloy may be used. Application of the present invention is not limited to the contact hole and the present invention may be applied to the via-hole.

Next, we will explain a film formation apparatus for carrying out the method for a contact metal of the present invention.

Figure 3:
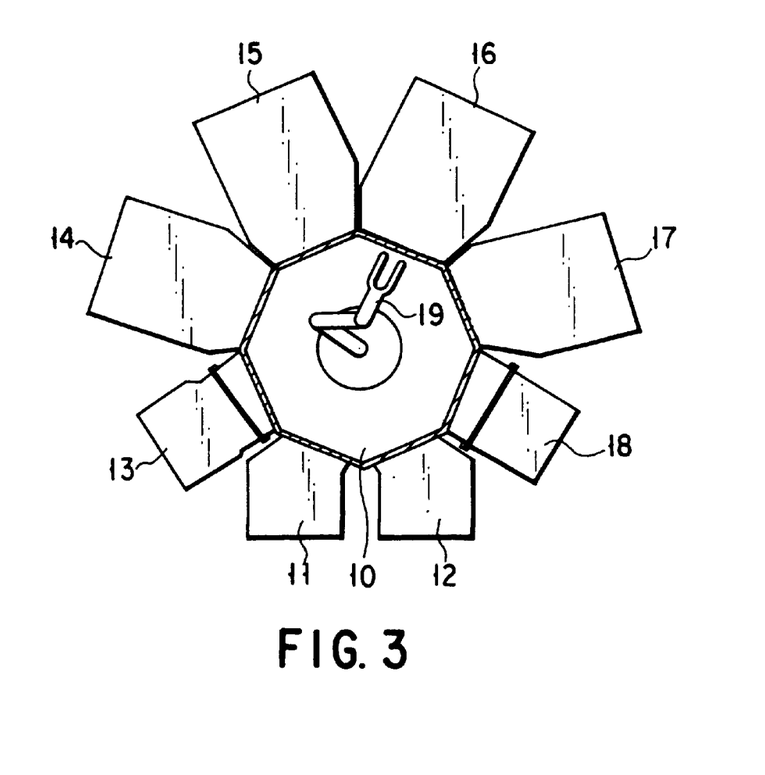
FIG. 3 is a schematic view of a multi-chamber type film deposition system for use in carrying out the method according to the present invention.

FIG. 3 is a schematic view of a metal film deposition system by CVD for carrying out the method of the present invention.

This system is called a cluster-tool type or a multi-chamber type. To be more specific, two load/unload cassette chambers 11, 12, a degas chamber 13, a Ti film deposition chamber 14, a pre-cleaning chamber 15, a TiN film deposition chamber 16, an Al film deposition chamber 17 and a cooling room 18 are arranged around the transfer room 10 positioned at the center with a gate valve interposed between them. Each of the chambers has a main chamber body having an evacuation function, inner equipment and peripheral equipment required for processing.

Figure 4:
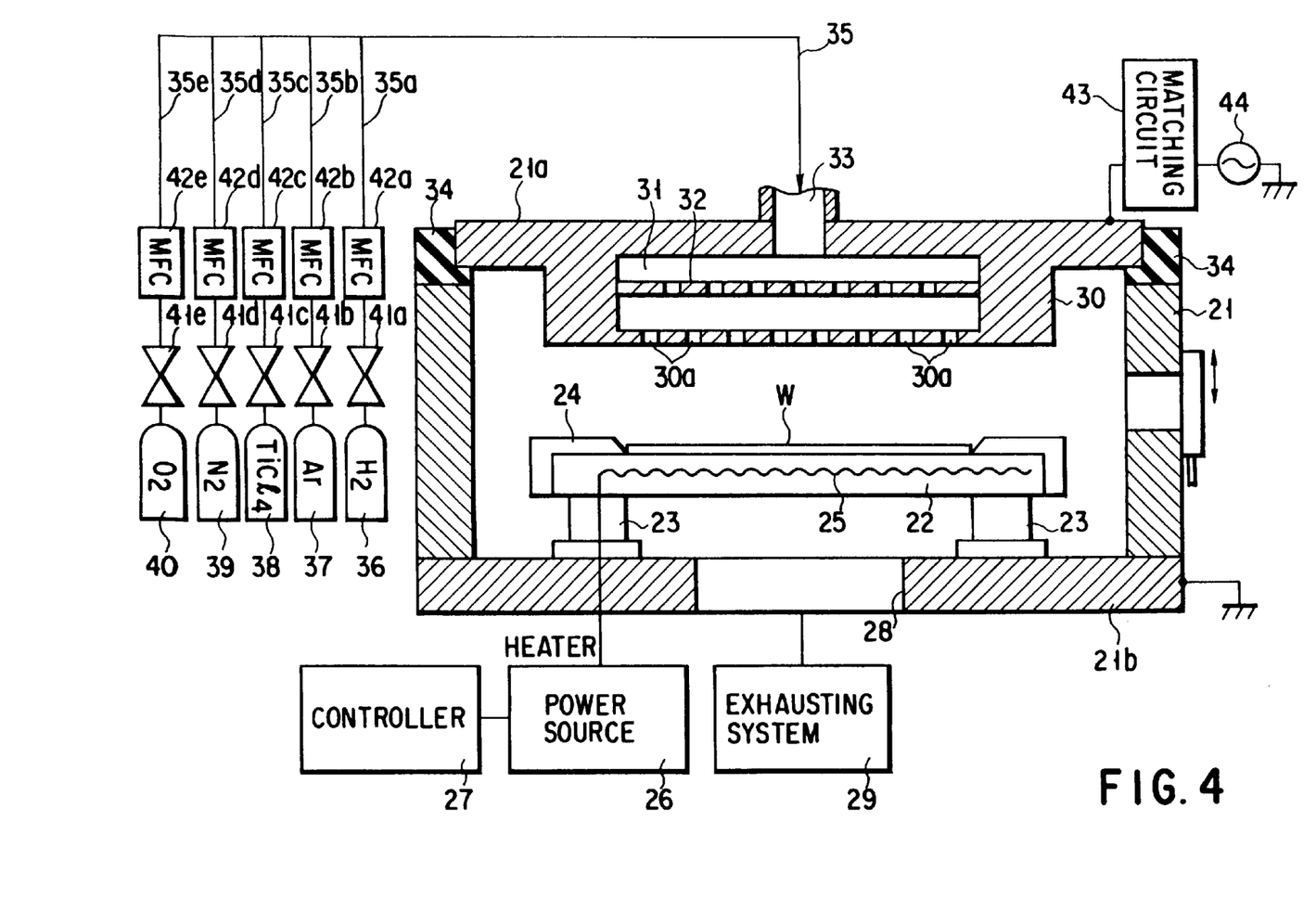
FIG. 4 is a view showing a structure of a Ti film forming equipment of the film deposition system shown in FIG. 3.

FIG. 4 shows a specific structure of the film forming equipment mainly constituted of the deposition chamber 14.

The Ti film deposition chamber 14 is constituted of a main chamber 21 of virtually a cylindrical shape. In the main chamber 21 constructed airtight, the semiconductor substrate W (object) is mounted horizontally on a susceptor 22 supported by cylindrical supporting members 23.

A guide ring 24 is provided on the outer periphery of the susceptor 22, for guiding the semiconductor substrate W. A heater 25 is built in the susceptor 22. The heater 25 is responsible for heating the semiconductor substrate W to a predetermined temperature by supplying a current from a power source 26. The temperature of the heater 25 is controlled by a controller 27 (connected to the power supply 26) on the basis of a detection signal from a temperature sensor (not shown) attached to the main chamber.

A shower head 30 is formed on the ceiling wall 21a of the main chamber 21 so as to face the semiconductor substrate W mounted on the susceptor 22. Numerous gas ejection holes 30a are formed in the surface of the shower head facing the substrate W. A dispersion plate 32 having numerous holes is positioned horizontally in a space 31 within the shower head 30.

A gas inlet 33 is formed at the center of the ceiling wall 21a of the main chamber 21, for introducing a gas into the shower head 30. The gas supply pipe 35 is connected to the gas inlet 33.

The gas supply pipe 35 is branched into pipes 35a to 35e which are connected to a $H_2$ source 36, an Ar source 37, a $TiCl_4$ source 38, a $N_2$ source 39, and an $O_2$ source 40, respectively. A desired gas is supplied from these gas sources by way of the gas supply pipe 35 and the shower head 30 into the main chamber 21.

When the Ti film is formed on the semiconductor substrate W by a gas mixture of $H_2$ gas, Ar gas, and $TiCl_4$ gas supplied in a predetermined amount, from the $H_2$ source 36, the Ar source 37, and the $TiCl_4$ source 38, respectively.

The nitriding is performed by supplying $N_2$ gas and $H_2$ gas respectively from the $N_2$ source 39 and the $H_2$ gas source 36. Thereafter, oxidation is performed by supplying $O_2$ gas from the $O_2$ gas source 40. The pipes 35a to 35e connected to the gas sources are equipped with respective valves 41a to 41e for controlling initiation/termination of gas supply, and mass-flow controllers 42a to 42e for controlling respective gas flow-rates.

High frequency power source 44 is connected to the ceiling wall 21a of the main chamber 21 via a matching circuit 43. A high frequency power is introduced through the ceiling wall 21a into the main chamber 21 to form a plasma. Note that the ceiling wall 21a is electrically insulated from the side wall of the main chamber 21 with an insulating member 34. The main chamber 21 is grounded.

An exhaust port 28 is formed in the bottom 21b of the main chamber 21. The main chamber 21 is evacuated by an exhausting system 29 through the exhaust port 28 to set the inner pressure at a desired pressure.

The TiN film deposition chamber 16 has the similar structure to the Ti film deposition chamber 14 except that a $TiCl_4$ source, an $NH_3$ source and an MMH source are provided as the gas sources. The Al film deposition chamber 17 has also the similar structure to the Ti film deposition chamber 14 except that gaseous dimethyl aluminum hydride (DMAH) or the like is used as a raw material and $H_2$ as a carrier gas.

In the aforementioned metal CVD deposition system, a single semiconductor substrate W is taken out from the load cassette chamber 11 by a transfer arm 19 and loaded into a pre-cleaning chamber 15 to remove a surface oxide or the like, with $BrCl_3$. Subsequently, the semiconductor substrate W is transferred into the degas chamber 13 by the transfer arm 19 to degas of the semiconductor substrate W.

Thereafter, the semiconductor substrate W is loaded into the main body 21 of the Ti film deposition chamber 14 by the transfer arm 19 and mounted on the susceptor 22. The main chamber 21 is maintained in high vacuum conditions by being evacuated by the exhaust system 9. The main chamber 21 is then set at a pressure of 1 Torr by introducing a process gas mixture. Subsequently, the process gas mixture containing Ar gas, $H_2$ gas, and $TiCl_4$ gas is supplied from the shower head 30 at a predetermined flow rate (e.g., Ar:1 SLM, $H_2$: 1 SLM, $TiCl_4$: 10 sccm), while the semiconductor substrate is maintained at a temperature from 450 to 600° C. In this state, a high frequency power is supplied from the high frequency power source 44 into the main chamber 21 to generate a plasma. Then, the formation of the Ti film 5 on the semiconductor substrate W is performed for a predetermined time.

After completion of the film formation, the supply of Ar gas and $TiCl_4$ gas is terminated. Then, the semiconductor substrate W is nitrided in the main chamber 21 while leaving it in the Ti film deposition chamber. The nitriding of the Ti film is performed as follows. First, a $N_2$–$H_2$ gas mixture is supplied from the shower head 30. The $N_2$ gas and the $H_2$ gas are supplied in predetermined flow amounts, for example, 500 sccm and 1500 sccm, respectively, to set the inner pressure of the main chamber 21 at about 1 Torr. Simultaneously supplying a high frequency power from the high frequency power source into the main chamber 21 to generate a plasma. As a result of the nitriding process, a thin nitrided film 6 is formed on the surface of the Ti film 5.

Subsequently, the Ti film surface is oxidized (post-nitriding oxidation) in the main chamber 21. More specifically, after the supply of $N_2$ gas and $H_2$ gas is terminated, $O_2$ gas is supplied into the main chamber 21 to oxidize active Ti which is not terminated with N and remains on the surface of the nitrided film 6. In this manner, active Ti is terminated with oxygen.

After the oxidation of the nitrided film 6 is completed, the semiconductor substrate W is unloaded from the Ti deposition chamber 14 (the main chamber 21) the transfer arm 19 and transferred to the transfer chamber 10, and then, loaded into the main chamber of the TiN film deposition chamber 16.

The TiN film deposition chamber 16 is constructed in a similar manner as the Ti film deposition chamber 14. The main chamber is maintained in high vacuum conditions by being evacuated by the exhausting system. The semiconductor substrate W is heated at, for example, 550 to 650° C. by the heater built in the susceptor. As the process gas, either one of $N_2$ gas, $NH_3$ gas and MMH gas, or $TiCl_4$ gas is used. Each of the gases is supplied at a predetermined flow rate (for example, $N_2$: 100 sccm, $NH_3$: 500 sccm, $TiCl_4$: 20 sccm) from the shower head to set the inner pressure of the main chamber at about 0.3 to 0.5 Torr. The film deposition process of the TiN film 7 is performed for a predetermined time without supplying high frequency power. As a result, the thin nitride film 6 formed on the Ti film 5 is integrated into part of the TiN film 7.

After deposition of the TiN film 7 is thus completed, in other words, after a double-layer contact metal layer is formed, the semiconductor substrate W is unloaded from the TiN film deposition chamber 16 and transferred into the transfer chamber 10, and then loaded into the Al film deposition chamber 17.

In the Al film deposition chamber 17, the Al layer 9 is formed on the contact metal layer 8 by the CVD method using a process gas containing DMAH and $H_2$ gas, to thereby fill the contact hole 3 and form wiring.

The semiconductor W having a desired structure, thus formed, is cooled in the cooling chamber 18 and stored in the unload cassette chamber 12.

In the aforementioned film deposition system, a film is formed by the CVD method in the Ti film deposition chamber 14. However, a PVD method may be used. Furthermore, oxidation is performed by supplying $O_2$ gas as the oxygen containing gas into the Ti film deposition chamber 14. Instead, oxidation may be carried out in the TiN film deposition chamber 16 by loading the semiconductor substrate W thereinto after the nitriding process before the TiN film deposition process. Alternatively, oxidation may be performed in another discrete process chamber.

The oxidation may be performed by exposing the semiconductor substrate to the air without particularly supplying the $O_2$ gas. For example, after Ti film is formed and nitrided in the Ti film deposition chamber 14, the semiconductor substrate W is temporarily transferred to the unload cassette chamber 12 and exposed to the air. In this case, most of the surface of the Ti film has been nitrided. Thus $TiO_2$ formation is limited to so small portion that it has little adverse affect on the electric contact.

As described, in the embodiment of the present invention, it is possible to terminate (oxidize) active Ti (not terminated in the Ti film nitriding process) in the oxidation process. As a result, etching of the Ti film 5 with $TiCl_4$ to be performed in a later TiN film forming step can be prevented. To explain more specifically, the thin nitride film 6 is present on the surface of the Ti film and an oxide is partly formed on the surface thereof. Since they are rarely etched with $TiCl_4$, the Ti film is prevented from being etched. Accordingly, the increase of the contact resistance caused by the removal of the contact metal film can be successfully prevented.

The experiment was conducted to demonstrate effects produced by the oxidation treatment. The results thereof will be explained below.

First, the Ti film of 20 nm thick is formed on the semiconductor substrate having numerous contact holes therein. The semiconductor substrate is nitrided in a plasma and oxidized in the air, followed by forming the TiN film of 50 nm thick thereon. On the other hand, the semiconductor substrate is nitrided in a plasma and then the TiN film is formed thereon. Both of them are measured for contact resistance.

Figure 5:
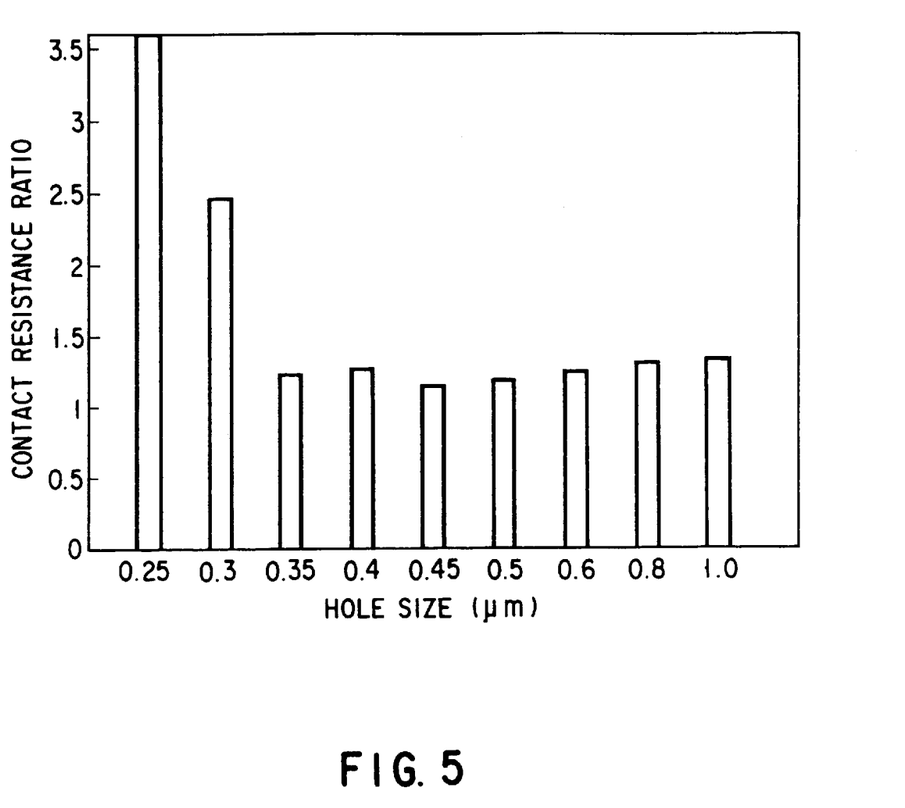
FIG. 5 is a graph indicating a contact-resistance ratio versus hole size.

The results of the contact resistance measurement are shown in FIG. 5. The contact resistance of the semiconductor substrate receiving only nitriding treatment is represented by symbol a. The contact resistance of the semiconductor substrate receiving both nitriding and oxidation, is represented by symbol b. The ratio of contact resistance (a/b) is determined with respect to each size of the holes.

As is apparent from Table 5, the film of the present invention formed through nitriding and oxidizing processes, always exhibits a lower contact resistance. The advantage of the present invention is particularly apparent in the case of a hole of 0.3 $\mu$m or less, for example, the ratio of the contact resistance (a/b) exhibits 3.5 in the case of 0.25 $\mu$m-hole.

The present invention is not limited to the aforementioned embodiments and may be modified in various ways. In the embodiments mentioned above, a contact metal layer is formed in the contact hole. However, the present invention may be applied to the case where the contact metal layer is formed in a via hole. Furthermore, the case is shown where the contact metal layer is formed by stacking the TiN film on the Ti film. However, the present invention is not limited to this and may be effectively applied to the case where another film is formed on the Ti film layer by a CVD method using a halogen containing gas when the Ti film is used as an electrode or the like. The semiconductor substrate is used as the substrate herein. However, the present invention may be applied to an insulative substrate having a circuit element formation region made of silicon thereon, like an LCD (liquid crystal display) substrate.

As described in the foregoing, the present invention is characterized in that the semiconductor substrate is nitrided after the Ti film is formed, to terminate active Ti present in the Ti film surface with nitrogen N, and then subjected to oxidation to terminate Ti, which has not been terminated with N, with oxygen (O). It is therefore possible to prevent the Ti film from being etched in the later CVD film deposition process using halogen containing gas. As a result, it is possible to prevent an increase of contact resistance caused by the removal of the contact metal film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a barrier metal layer which prevents film peeling in the contact region between a wiring and an electrode of a circuit device formed on a semiconductor substrate, said method comprising:

forming a Ti film over the entire surface of a semiconductor substrate having an insulating film, said insulating film having a contact hole through which part of the semiconductor substrate is exposed;

introducing a nitride-containing gas and performing a nitriding treatment on the Ti film, thereby terminating the surface of the Ti film with nitride;

reacting un-nitrided Ti that remains on the surface of said treated film with an oxygen-containing gas, thereby causing said un-nitrided Ti to unite with oxygen forming $TiO_2$; and forming a barrier metal layer on the surface of the Ti film terminated with nitride and containing $TiO_2$.

2. A method according to claim 1, wherein the nitride-containing gas selected from the group consisting of $NH_3$ and MMH and is introduced using $N_2$ as a carrier gas.

3. A method according to claim 1, wherein the nitriding treatment is performed by generating a plasma using a $N_2+H_2$ gas mixture.

4. A method according to claim 1, wherein the oxygen-containing gas is selected from $O_2$, air and active oxygen compounds comprising $O_3$, $H_2O$, $N_2O$, $NO_2$ and mixtures thereof.

5. A method according to claim 1, wherein the oxidation treatment is performed to unite the reactive un-nitrided Ti with oxygen by introducing the oxygen-containing gas into the same Ti film deposition chamber where nitriding of the Ti film has been completed.

6. A method according to claim 1, wherein the oxidation treatment is performed to unite the reactive un-nitrided Ti with oxygen by introducing the oxygen-containing gas in a TiN film deposition chamber after nitriding the Ti film and transferring the semiconductor substrate to the TiN film deposition chamber.

7. A method according to claim 1, wherein the oxidation treatment is performed to unite the reactive un-nitrided Ti with oxygen by exposing the semiconductor substrate to the open atmosphere after forming and nitriding the Ti film in the Ti deposition chamber and transferring the semiconductor substrate to a cassette chamber.

8. A method according to claim 4, wherein the oxidation treatment is performed to unite the reactive un-nitrided Ti with oxygen by introducing the oxygen-containing gas into the same Ti film deposition chamber where nitriding of the Ti film has been completed.

9. A method according to claim 4, wherein the oxidation treatment to unite the reactive un-nitrided Ti with oxygen is performed by introducing the oxygen-containing gas in a TiN film deposition chamber after nitriding the Ti film and transferring the semiconductor substrate to the TiN film deposition chamber.

10. A method according to claim 4, wherein the oxidation treatment is performed to unite the reactive un-nitrided Ti with oxygen by exposing the semiconductor substrate to the open atmosphere after forming and nitriding the Ti film in the Ti deposition chamber and transferring the semiconductor substrate to a cassette chamber.

11. A method according to claim 1, wherein the barrier metal layer is a TiN film formed by a CVD (chemical vapor deposition) method.

12. A method of forming a barrier metal layer which prevents film peeling in the contact region between a wiring and an electrode of a circuit device formed on a semiconductor substrate, said method comprising:

forming a Ti film over the entire surface of a semiconductor substrate having an insulating film, said insulating film having contact hole through which part of the semiconductor substrate is exposed;

generating a plasma by a mixed gas of $N_2+H_2$ and performing a nitriding treatment on a surface of the Ti film, thereby terminating the surface of the Ti film with nitride;

reacting un-nitrided Ti that remains on the surface of said treated film with an oxygen-containing gas, thereby causing said un-nitrided Ti to unite with oxygen forming $TiO_2$;

forming a TiN film on the surface of the Ti film terminated with nitride and containing $TiO_2$; and forming a refractory metal layer on the TiN film.

13. A method according to claim 12, wherein the oxygen-containing gas is selected from $O_2$, air and active oxygen compounds comprising $O_3$, $H_2O$, $N_2O$, $NO_2$ and mixtures thereof.

14. A method according to claim 12, wherein the oxidation treatment is performed to unite the reactive un-nitrided Ti with oxygen by introducing the oxygen-containing gas into the same Ti film deposition chamber where nitriding of the Ti film has been completed.

15. A method according to claim 12, wherein the oxidation treatment to unite the reactive un-nitrided Ti with oxygen is performed by introducing the oxygen-containing gas in a TiN film deposition chamber after nitriding the Ti film and transferring the semiconductor substrate to the TiN film deposition chamber.

16. A method according to claim 12, wherein the oxidation treatment is performed to unite the reactive un-nitrided Ti with oxygen by exposing the semiconductor substrate to the open atmosphere after forming and nitriding the Ti film in the Ti deposition chamber and transferring the semiconductor substrate to a cassette chamber.

17. A method according to claim 13, wherein the oxidation treatment is performed to unite the reactive un-nitrided Ti with oxygen by introducing the oxygen-containing gas into the same Ti film deposition chamber where nitriding of the Ti film has been completed.

18. A method according to claim 13, wherein the oxidation treatment to unite the reactive un-nitrided Ti with oxygen is performed by introducing the oxygen-containing gas in a TiN film deposition chamber after nitriding the Ti film and transferring the semiconductor substrate to the TiN film deposition chamber.

19. A method according to claim 13, wherein the oxidation treatment is performed to unite the reactive un-nitrided Ti with oxygen by exposing the semiconductor substrate to the open atmosphere after forming and nitriding the Ti film in the Ti deposition chamber and transferring the semiconductor substrate to a cassette chamber.

20. A method according to claim 12, wherein the barrier metal layer is a TiN film formed by a chemical vapor deposition.

21. A method according to claim 12, wherein the refractory metal layer is selected from Al, W, and Al alloy and a W alloy.

22. A method of forming a barrier metal layer which prevents film peeling in the contact region between a wiring and an electrode of a circuit device formed on a semiconductor substrate, said method comprising:

forming a Ti film over the entire surface of a semiconductor substrate having an insulating film, said insulating film having a contact hole through which part of the semiconductor substrate is exposed;

introducing a nitride-containing gas and performing a nitriding treatment on the surface of the Ti film, thereby terminating the surface of the Ti film with nitride;

reacting un-nitrided Ti that remains on the surface of said treated film with an oxygen-containing gas, thereby causing said un-nitrided Ti to unite with oxygen forming $TiO_2$;

forming a barrier metal layer on the surface of the Ti film terminated with nitride and containing $TiO_2$; and forming a refractory metal layer on the barrier metal layer.

23. A method according to claim 22, wherein the nitride-containing gas is selected from the group consisting of $NH_3$ and MMH and is introduced using $N_2$ as a carrier gas.

24. A method according to claim 22, wherein the nitriding treatment is performed by generating a plasma using $N_2+H_2$ gas mixture.

25. A method according to claim 22, wherein the oxygen-containing gas is selected from $O_2$, air and active oxygen compounds comprising $O_3$, $H_2O$, $N_2O$, $NO_2$ and mixtures thereof.

26. A method according to claim 22, wherein the oxidation treatment is performed to unite the reactive un-nitrided Ti with oxygen by introducing the oxygen-containing gas into a same Ti film deposition chamber where nitriding of the Ti film has been completed.

27. A method according to claim 22, wherein the oxidation treatment to unite the reactive un-nitrided Ti with oxygen is performed by introducing the oxygen-containing gas in a TiN film deposition chamber after nitriding the Ti film and transferring the semiconductor substrate to the TiN film deposition chamber.

28. A method according to claim 13, wherein the oxidation treatment is performed to unite the reactive un-nitrided Ti with oxygen by exposing the semiconductor substrate to the open atmosphere after forming and nitriding the Ti film in the Ti deposition chamber and transferring the semiconductor substrate to a cassette chamber.

29. A method according to claim 25, wherein the oxidation treatment is performed to unite the reactive un-nitrided Ti with oxygen by introducing the oxygen-containing gas into a same Ti film deposition chamber where nitriding of the Ti film has been completed.

30. A method according to claim 25, wherein the oxidation treatment to unite the reactive un-nitrided Ti with oxygen is performed by introducing the oxygen-containing as in a TiN film deposition chamber after nitriding the Ti film and transferring the semiconductor substrate to the TiN film deposition chamber.

31. A method according to claim 25, wherein the oxidation treatment is performed to unite the reactive un-nitrided Ti with oxygen by exposing the semiconductor substrate to the open atmosphere after forming and nitriding the Ti film in the Ti deposition chamber and transferring the semiconductor substrate to a cassette chamber.

32. A method according to claim 22, wherein the barrier metal layer is a TiN film formed by chemical vapor deposition.

33. A method according to claim 22, wherein the refractory metal layer is one of Al, W, an Al alloy and a W alloy.

* * * * *